United States Patent
Liaw et al.

[11] Patent Number: 5,851,912
[45] Date of Patent: Dec. 22, 1998

[54] MODIFIED TUNGSTEN-PLUG CONTACT PROCESS

[75] Inventors: Jhon-Jhy Liaw, Taipei; Jin-Yuan Lee; Ming-Chang Teng, both of Hsin-Chu, all of Taiwan

[73] Assignee: Taiwan Semiconductor Manufacturing Company, Ltd., Hsin-Chu, Taiwan

[21] Appl. No.: 824,190

[22] Filed: Mar. 10, 1997

Related U.S. Application Data

[63] Continuation of Ser. No. 583,790, Jan. 11, 1996, abandoned.

[51] Int. Cl.$^6$ .................................................. H01L 21/283
[52] U.S. Cl. ........................ 438/621; 438/627; 438/632; 438/637; 438/656; 438/663
[58] Field of Search .................................. 437/190, 192, 437/195, 247, 20; 257/751, 752, 753, 763; 438/622, 626, 627, 628, 632, 646, 648, 621, 663, 637, 639, 656

[56] References Cited

U.S. PATENT DOCUMENTS

| | | | |
|---|---|---|---|
| 5,102,826 | 4/1992 | Ohshima et al. | 437/200 |
| 5,227,191 | 7/1993 | Nagashima | 438/672 |
| 5,238,872 | 8/1993 | Thalapaneni | 437/190 |
| 5,272,112 | 12/1993 | Schmitz et al. | 438/672 |
| 5,302,549 | 4/1994 | Santangelo et al. | 437/188 |
| 5,322,812 | 6/1994 | Dixit et al. | 437/60 |
| 5,364,817 | 11/1994 | Lur et al. | 437/192 |
| 5,422,308 | 6/1995 | Nicholls et al. | 437/192 |
| 5,510,296 | 4/1996 | Yen et al. | 437/200 |
| 5,554,565 | 9/1996 | Liaw et al. | 437/192 |

OTHER PUBLICATIONS

Wolf, S., Silicon Processing for the VLSI Era, Lattice Press, vol. 2, 1990, pp. 194–199, 245–252.

Wolf, S., Silicon Processing, vol. 1, 1986, Lattice Press, pp. 56–58, 187–191, 303–308, 325–327.

El–Kareh, B., Fundamentals of Semiconductor Processing Technologies, Kluwer Academic Publishers, 1995, pp. 556–557.

Wolf, S., et al., Silicon Processing for the VLSI Era, vol. 1, Process Technology, Lattice Press, 1986, pp. 244, 307.

*Primary Examiner*—T. N. Quach
*Attorney, Agent, or Firm*—George O. Saile; Stephen B. Ackerman

[57] ABSTRACT

An method for the fabrication of an ohmic, low resistance contact to heavily doped silicon is described using a CVD deposited tungsten plug provided with Ti/TiN barrier metallurgy. The method provides for surface planarization using a borophosphosilicate glass insulator deposited on the silicon. After the glass is flowed to planarize its surface, contact holes are patterned in the glass and the exposed silicon substrate contacts are implanted. Instead of activating the implant with a rapid-thermal-anneal at this point the Ti/TiN barrier metallurgy is applied first followed by the anneal. This provides support for the glass at the upper corners of the contact opening during the anneal and thus prevents them from deforming and encroaching into the contact hole opening. By using the Ti/TiN metallurgy to support the glass, higher annealing temperatures are permitted, providing not only for adequate dopant activation but also for a lower contact resistance and improved bonding of the metallurgy to the silicate glass.

12 Claims, 5 Drawing Sheets

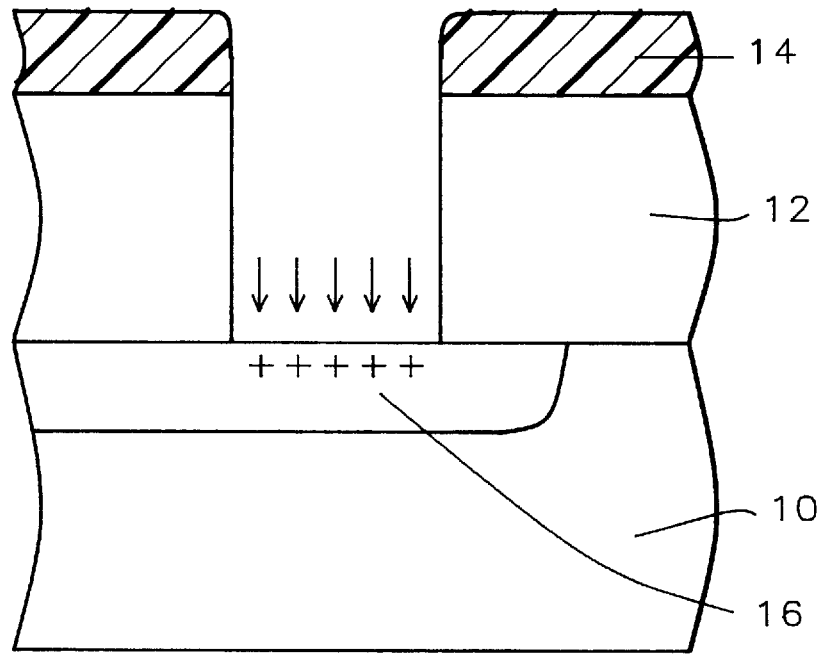
FIG. 1A – Prior Art
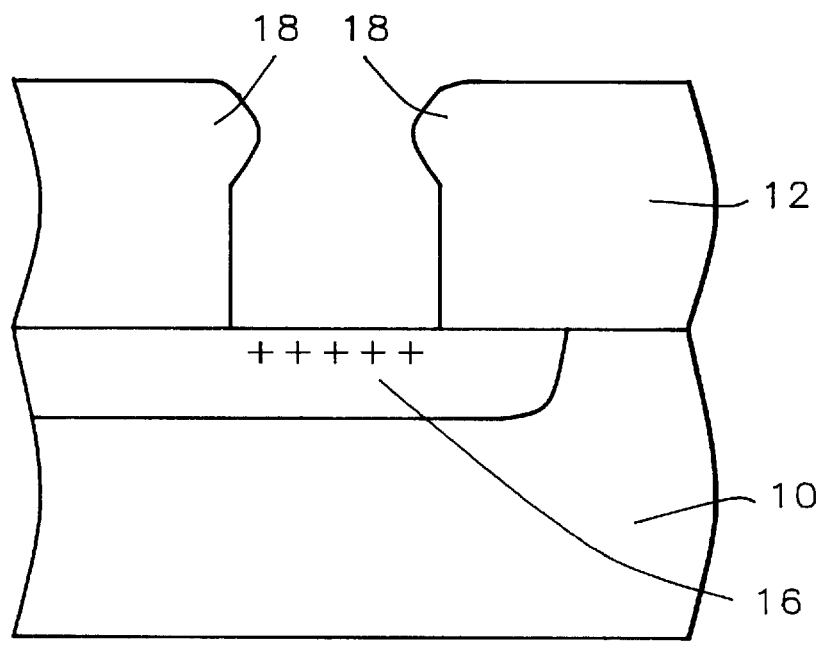
FIG. 1B – Prior Art

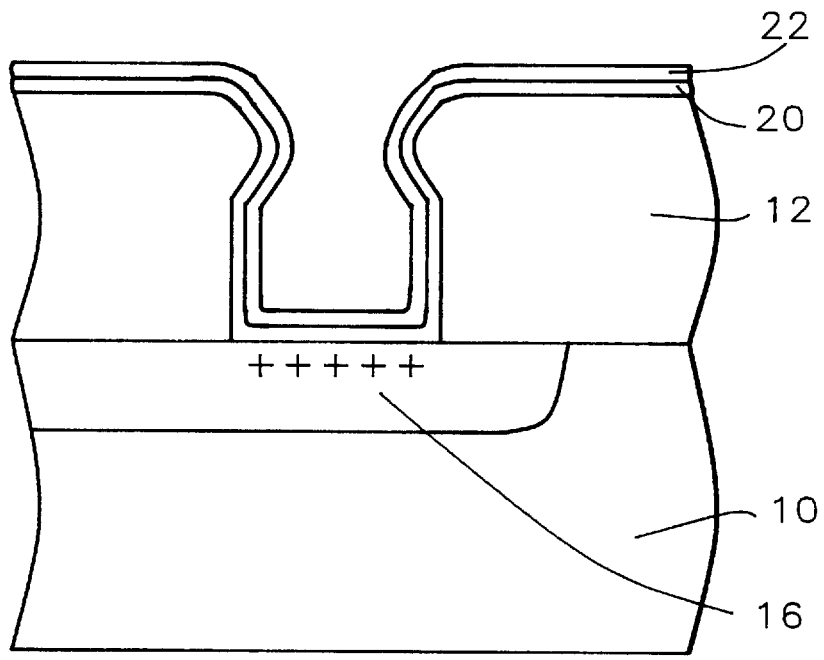
FIG. 1C – Prior Art
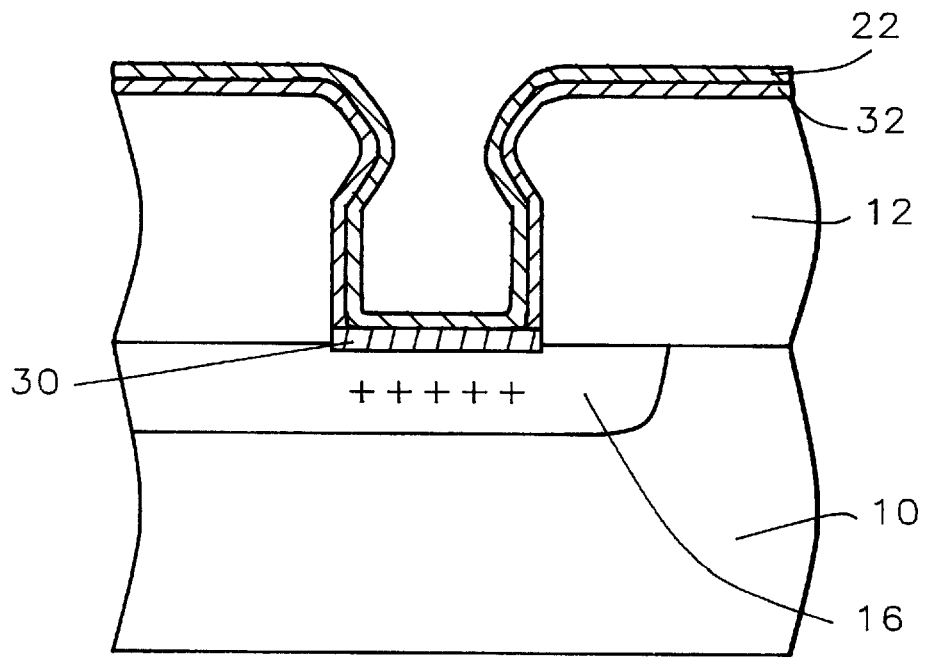
FIG. 1D – Prior Art

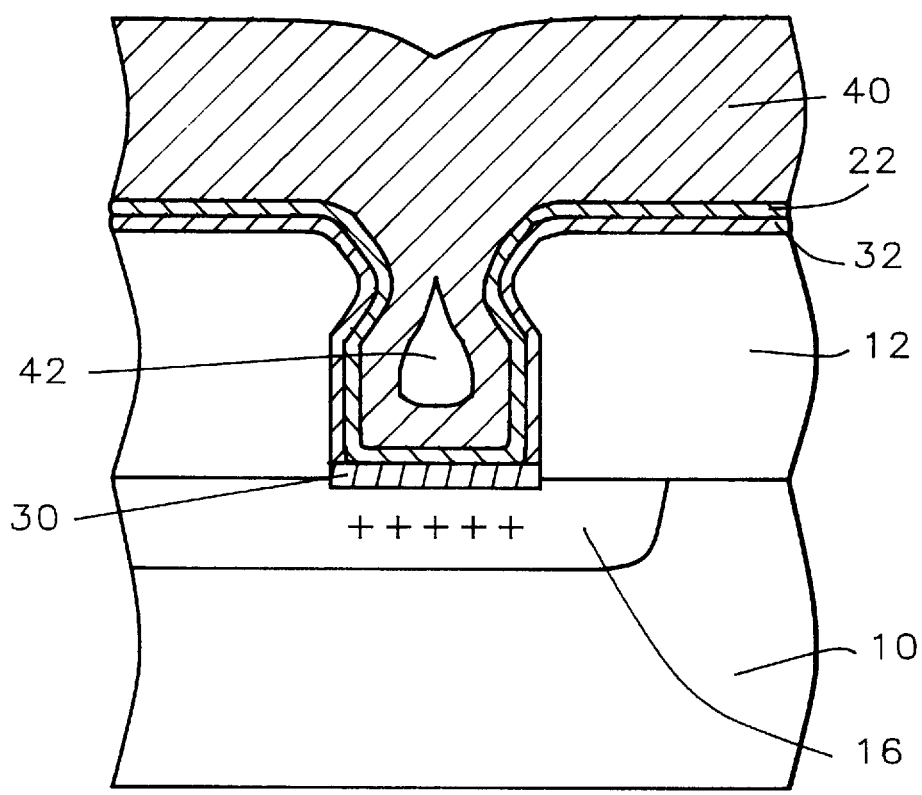
FIG. 1E – Prior Art

MODIFIED TUNGSTEN-PLUG CONTACT PROCESS

This is a continuation of Ser. No. 08/583,790 filed Jan. 11, 1996, now abandoned.

BACKGROUND OF THE INVENTION

(1) Field of the Invention

The invention relates to processes for the manufacture of semiconductor devices and more particularly to processes for forming metal-to-silicon contacts.

(2) Description of Prior Art

Very large scale integrated circuit technology(VLSI) comprises the formation of isolated semiconductor devices within the surface of silicon wafers and interconnecting these devices with metallic wiring layers above the surface. This interconnection system usually consists of two or more levels of interconnection metallurgy, separated by insulation layers. The first layer of metallization(sometimes called the "book metal") is used to define small fundamental circuits, for example, a simple TTL gate comprised of two bi-polar transistors and two resistors. This metallization level provides the connections to the silicon devices themselves. A second level of metal lines is then provided to interconnect these primary circuits into larger units. A final layer of metallization is applied to connect the highest level of circuitry to pads which form the chip's external connections. Connections between metal levels are made using metal filled via holes in an insulation layer, which usually consists of silicon oxide, phosphosilicate glass(PSG), or borophosphosilicate glass(BPSG). Each level of metallurgy has a unique set of requirements which define its composition and processing. The first level must provide a low resistance (ohmic) contact to the silicon. Unlike metal-to-metal contacts, the metal-to-semiconductor contact is highly dependent on both the doping level and the doping type of the silicon. Current technology requires that the doping level of the silicon be of the order of $10^{20}$ atoms/cm$^3$. This level of doping provides a sufficiently narrow depletion region and sufficient electron concentration to achieve adequate electron penetration of the interfacial energy barrier. The metal chosen for this contact must have a low electron work function as well as a low resistivity. Earlier technology used aluminum because of its low resistivity, good adhesion, and ease of processing. However, as the technology advanced, many modifications were necessary to cope with problems that arose with decreasing device size and increasing current requirements. Aluminum still remains the basic metal of choice for integrated circuit wiring although its properties have been improved by the addition of small quantities of silicon(Si), tungsten(W), or titanium(Ti). These same metals, their alloys, and nitrides have also gained major importance by providing greatly improved silicon-to-metal contacts. Not only do they improve the electrical quality of the contact but they also act as barriers which prevent metal penetration into the silicon. Such penetration is particularly harmful to shallow diffused devices.

Device miniaturization has brought on a number of obstacles which particularly affect the silicon-to-metal contacts. The sizes of the contacts have been reduced to the sub-micron range. Attempts to adapt the deposition of aluminum, either pure or alloyed with silicon, or other refractory metals, by evaporation or rf sputtering have required the use of tapered contact openings in order to achieve good step coverage. The contact openings can be tapered by a variety of etching techniques. Earlier methods used flowed photoresist to provide a taper which was replicated in the oxide contact opening by reactive-ion-etching(RIE). Other techniques used BPSG as the insulator which was flowed prior to metal deposition to give a large angle taper along the entire opening. Thalapaneni U.S. Pat. No. 5,238,872 describes a technique wherein a Ti-TiW-AL contact is formed into a BPSG layer. The upper part of the contact opening is widened by an initial isotropic chemical etching. Then RIE is used to provide a vertical wall to the base of the contact opening.

Recent advances in contact and via technology have lead to the use of tungsten for filling contact and via openings. Tungsten has a sufficiently low resistivity and it can be deposited at temperatures below 500° C. by chemical vapor deposition(CVD) using the hydrogen or silane reduction of tungsten hexafluoride(WF$_6$). The deposition is very conformal and results in remarkably good filling of vertical walled contact hole openings. Thus the need for space-wasting tapered contact openings is eliminated. A thin layer of Ti/TiW deposited into the contact hole opening prior to tungsten deposition, provides not only a better contact and diffusion barrier to the silicon, but also greatly improves the adhesion of the tungsten to the BPSG sidewall. Although the tungsten layer can be patterned to provide lateral wiring lines, the preferred method is to pattern the layer to expose only the studs and wire these with traditional aluminum interconnection metallurgy. The studs are referred to as W-plugs.

A conventional process for forming W-plug contacts on a silicon wafer 10 substrate is shown in FIG. 1A through FIG. 1E. Referring first to FIG. 1A, a layer of BPSG 12 between 5,000 and 15,000 Angstroms thick is deposited onto the silicon surface. As deposited, the surface of the BPSG layer replicates the non-planar surface of the silicon substrate. The wafer is annealed at 800° C. to 900° C. causing the BPSG to flow, thereby improving the planarity of its surface. Photoresist 14 is applied and the contact openings are patterned using standard photolithographic techniques. Reactive-ion-etching(RIE) is then use to form the vertical openings in the BPSG.

Although the flowing of the BPSG provides a smooth upper surface, its thickness is not necessarily exactly the same over all the contact areas of the chip. The thickness depends upon the topology of the surrounding area. Thus when the contact holes are subsequently opened by RIE, some over-etching will occur at contacts where the BPSG is thinner. Since the substrate diffusions are very shallow to begin with, any over-etching could jeopardize them. Additionally, because of device miniaturization, the area of the contact approaches that of the silicon active area. A slight misalignment of the contact mask could easily cause the contact opening to fall off the device implant area resulting in shorted junctions.

For these reasons an implant is made through the contact openings to re-enforce the active regions of the devices. The silicon in the exposed contact areas is implanted with the appropriate dopant to provide a concentration of $2 \times 10^{14}$ to $2 \times 10^{15}$ dopant atoms/cm$^2$. Some products may require only one type of contact. For example, in NMOS technology the diffused contacts can be entirely of n-type. Here, the appropriate implant may be performed without masking. For complimentary MOS(CMOS) technology, where both n- and p-type contacts are required, a first implant of p-type dopant is directed at all the contacts. Then the p-type contacts are covered with a photoresist block-out mask and the n-contacts are implanted with a higher dose of n-type dopant to over-compensate the previous p-type implant.

Using this procedure eliminates the need for an additional photolithographic step to shield the n-contacts.

Under the conventional procedure, these contact implants are next activated by rapid-thermal-annealing(RTA). This causes the BPSG to flow at the upper edge 18 (FIG. 1B) and severely encroach into the contact opening if the anneal temperature is above 950° C. The Ti/TiN barrier metallization 20,22 (FIG. 1C) is then deposited and a second annealing is performed between 550° and 700° C. to secure a bond of the Ti to the silicon 30 and to the BPSG 32 (FIG. 1D). Finally a layer of CVD tungsten 40 (FIG. 1E) is deposited to fill the contact opening. The encroachment of the BPSG into the contact opening causes a restriction to the filling of the contact hole by the tungsten 40 leaving a void 42 in the center. Depending upon the degree of the overhang and the size of the contact opening, the thin tungsten walls surrounding the void have the potential for subsequent electrical failure.

SUMMARY OF THE INVENTION

Under the modified procedure of this invention, the Ti/TiN metals are deposited prior to the contact implant anneal. Not only does this eliminate the need for a second barrier metal anneal, but it also provides support and protection of the BPSG sidewall, preventing it from rounding off at the upper corners and encroaching into the contact opening. Additionally, this support permits a higher subsequent annealing temperature than does the conventional process. This results in a lower contact resistance of the metal-silicon contact as well as significantly improved adhesion of the Ti/TiN to the BPSG. Finally, the filling of the contact opening by the tungsten is free of voids.

BRIEF DESCRIPTION OF THE DRAWINGS

FIG. 1A through FIG. 1E show the steps of the conventional process for forming the W-plug contact.

DESCRIPTION OF THE PREFERRED EMBODIMENTS

Figure 2A:
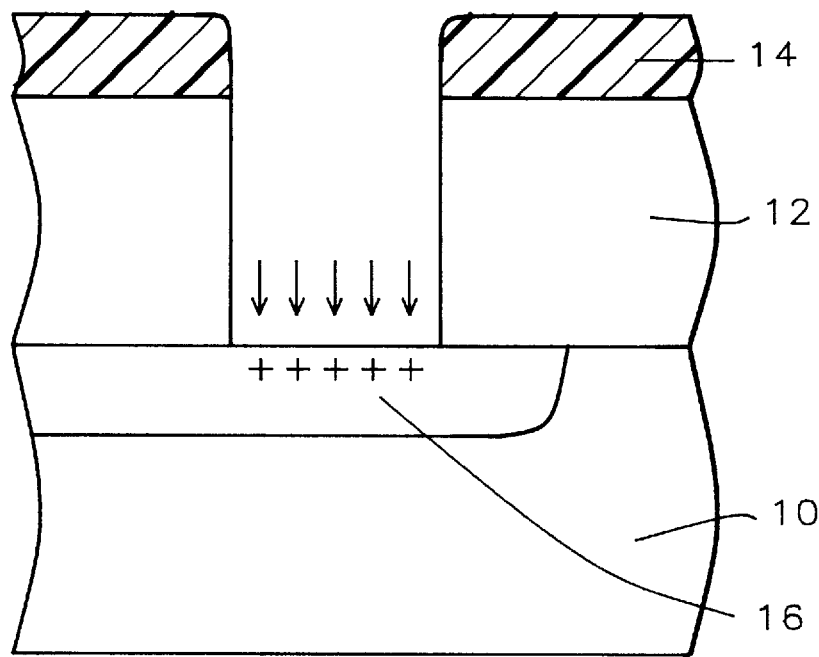
FIG. 2A through FIG. 2D show the steps of the contact forming process taught by this invention.

Referring now to FIG. 2A, a p-doped <100> oriented monocrystalline silicon wafer 10 is provided. Using standard processing techniques familiar to those in the integrated circuit manufacturing industry, semiconductor devices such as self-aligned polysilicon gate field effect transistors, are formed within the surface of the silicon wafer. The heavily doped source and drain implants of arsenic or phosphorous 16 comprise the active areas of these devices to which metallic contacts are later formed. A layer of borophosphosilicate glass(BPSG) 12 between 5,000 and 15,000 Angstroms thick is deposited onto the silicon surface. As deposited, the surface of the BPSG layer replicates the non-planar surface of the silicon substrate. The wafer is annealed at 800° to 900° C. causing the BPSG to flow, thereby enhancing the planarity of its surface. Photoresist 14 is applied and the contact openings are patterned using standard photolithographic techniques. Reactive-ion-etching(RIE) is then used to open the contacts areas in the BPSG layer and expose the device diffusions on the silicon surface. Appropriate etchants and techniques to provide high etch-rate-ratios are well known to those practicing this art. The taper of the walls of the resultant opening can be well controlled, and the etching can be cleanly terminated at the silicon surface.

Ions of the conductivity type corresponding to that of the exposed silicon are next implanted at a dose of $2\times10^{14}$ to $2\times10^{15}$ atoms/cm$^2$ and at energies of 30 to 100 keV. For this embodiment, phosphorous atoms are used to re-enforce the n-type contacts.

In another embodiment comprising CMOS product having both n- and p-type contacts, the wafer is first given a blanket boron implant using $2\times10^{14}$ to $5\times10^{14}$ BF$_2^+$ atoms/cm$^2$. Both n- and p-contacts are implanted. Next the p-contacts are covered by a photoresist block-out mask and the n-contacts are implanted with phosphorous at a dose of $1\times10^{15}$ to $2\times10^{15}$ atoms/cm$^2$. This phosphorous dose exceeds the corresponding boron dose in order to overcompensate the blanket implant.

Figure 2B:
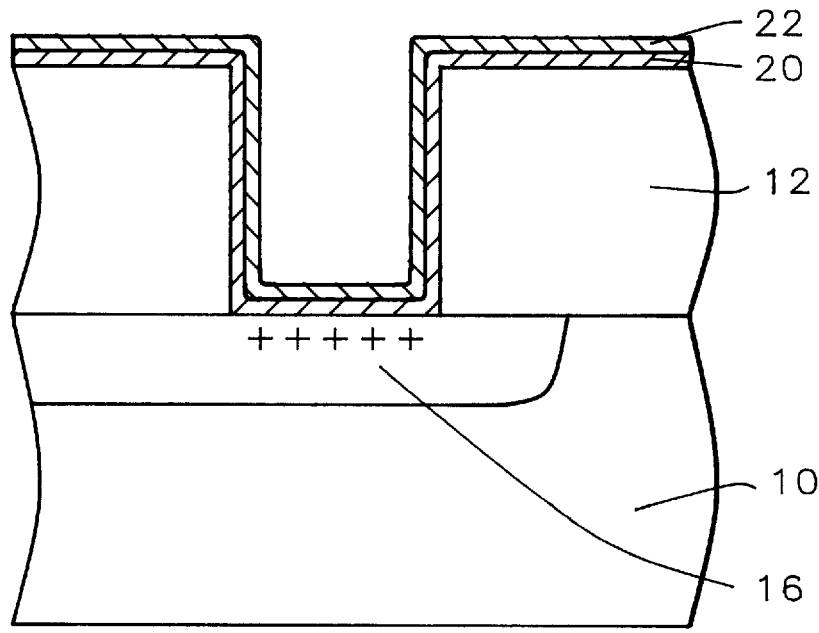

Referring now to FIG. 2B, approximately 400 Angstroms of titanium 20 and 1,100 to 1,300 Angstroms of titanium nitride 22 are deposited onto the wafer after stripping the photoresist. These films are deposited by rf sputtering.

Figure 2C:
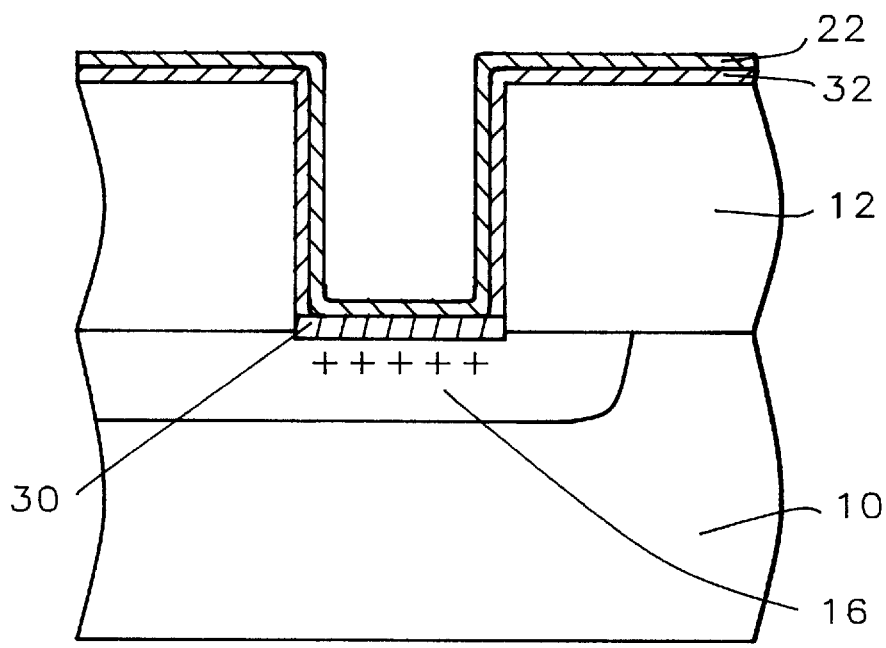

The wafer is then exposed to a rapid-thermal-annealing cycle creating temperatures from 900° to 1000° C. (FIG. 2C). During this period which normally lasts for about 20 seconds, the titanium layer reacts with the silicon to form TiSi$_2$ 30 and at the same time also forms an intimate chemical bond with the BPSG by forming titanium silicate 32. The implanted dopant atoms are electrically activated during this step. Because the metal films were deposited prior to the high temperature anneal, they provide support for the SPSG at the mouth of the contact hole, preventing its deformation and encroachment into the opening.

Figure 2D:
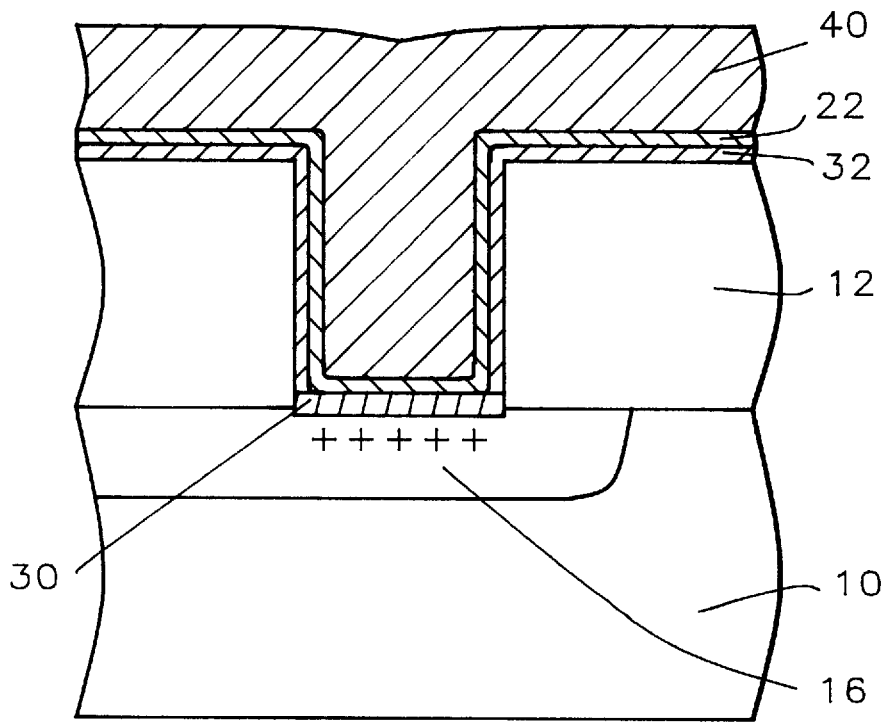

A layer tungsten 40(FIG. 2D) nominally 5,000 Angstroms thick is then deposited by CVD using tungsten hexafluoride and hydrogen. The deposition is carried out in a cold-walled, low temperature CVD reactor between 415° C. and 500° C.

Because the walls of the contact openings remain vertical and undistorted, the filling by tungsten is thorough and the plug is without voids. The tungsten layer 40 is then patterned with photoresist and etched to define isolated tungsten plugs. These plugs are subsequently contacted by the preferred interconnection metallurgy.

The embodiment of FIG. 2 uses a p-type substrate. It should be well understood by those skilled in the art that n-type substrate conductivities may also be used. It should be further understood that the substrate conductivity type as referred to here does not necessarily refer to the conductivity of the starting wafer but could also be the conductivity of a diffused region within a wafer wherein the semiconductor devices are incorporated. Such situations encountered in the twin-well CMOS technology.

Correspondingly, whereas the embodiment uses arsenic or phosphorous as the implant for the source and drain implants in a p-type well, boron would be used as an implant in an n-type well.

While the invention has been particularly shown and described with reference to the preferred embodiments thereof, it will be understood by those skilled in the art that various changes in form and details may be made without departing from the spirit and scope of the invention.

What is claimed is:

1. A method of forming a void free tungsten plug to a silicon semiconductor device comprising:

providing a semiconductor substrate;

forming semiconductor devices within the surface of said semiconductor substrate;

forming a layer of silicate glass, which is flowable within the temperature range of between about 800° and 900° C., over said semiconductor substrate;

flowing said silicate glass by heating;

depositing a photoresist layer over said layer of silicate glass;

patterning said photoresist layer to define a contact hole opening;

etching said layer of silicate glass with a unidirectional dry etching technique thereby forming a contact opening with a vertical walled profile;

implanting dopant atoms into the contact opening;

removing said photoresist layer;

forming a titanium layer over said layer of silicate glass;

forming a barrier metal layer over said titanium layer;

subjecting said semiconductor substrate to rapid thermal annealing after said barrier metal layer has been formed whereby said vertical walled profile is sustained;

depositing a tungsten layer over said semiconductor substrate; and etching said tungsten layer to form an isolated tungsten plug.

2. The method of claim 1 wherein the layer of silicate glass is borophosphosilicate glass(BPSG) of approximately 5,000 to 15,000 Angstroms thickness.

3. The method of claim 1 wherein the titanium layer is between 300 and 800 Angstroms thick.

4. The method of claim 1 wherein the barrier metal layer is titanium nitride(TiN) and is between 800 and 2,000 Angstroms thick.

5. The method of claim 1 wherein the barrier metal layer is TiW and is between 800 and 2,000 Angstroms thick.

6. The method of claim 1 wherein said rapid thermal annealing produces a surface temperature of between 900° C. and 1000° C. on said semiconductor substrate.

7. A method of forming void free tungsten plug contacts to silicon semiconductor devices with both n and p type active areas on the same semiconductor substrate and providing connection from these active areas to a metallic interconnection network comprising:

providing a semiconductor substrate;

forming semiconductor devices with both n and p type active areas within the surface of said semiconductor substrate;

forming a layer of silicate glass, which is flowable within the temperature range of between about 800° and 900° C., over said semiconductor substrate;

flowing said layer of silicate glass by heating;

depositing a first photoresist layer over said layer of silicate glass;

patterning said first photoresist layer to define contact hole openings;

etching said layer of silicate glass with a unidirectional dry etching technique thereby forming contact openings with an vertical walled profile;

implanting a first dose of dopant atoms into the contact openings;

depositing a second photoresist layer over said first photoresist layer;

patterning said second photoresist layer to expose only the contact openings to n-type active areas;

implanting a second dose of dopant atoms;

removing said first photoresist layer and said second photoresist layer;

forming a titanium layer over said layer of silicate glass;

forming a barrier metal layer over said titanium layer;

subjecting said semiconductor substrate to rapid thermal annealing after said barrier metal layer has been formed whereby said vertical walled profile is sustained;

depositing a tungsten layer over said semiconductor substrate; and etching said tungsten layer to form tungsten plug contacts.

8. The method of claim 7 wherein the layer of silicate glass is borophosphosilicate glass(BPSG) of approximately 5,000 to 15,000 Angstroms thickness.

9. The method of claim 7 wherein the titanium layer is between 300 and 800 Angstroms thick.

10. The method of claim 7 wherein the barrier metal layer is titanium nitride(TiN) and is between 800 and 2,000 Angstroms thick.

11. The method of claim 7 wherein the barrier metal layer is TiW and is between 800 and 2,000 Angstroms thick.

12. The method of claim 7 wherein said rapid thermal annealing produces a surface temperature of between 900° C. and 1000° C. on said semiconductor substrate.

* * * * *